(12) United States Patent
Law et al.

(10) Patent No.: US 7,219,247 B2
(45) Date of Patent: *May 15, 2007

(54) METHODS AND APPARATUS FOR REPLACING COOLING SYSTEMS IN OPERATING COMPUTERS

(75) Inventors: Randall Allan Law, Surrey (CA); Kent Graham Bodell, Port Moody (CA); David Ray Londry, Surrey (CA)

(73) Assignee: Cray Canada Inc., Burnaby (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/327,467

(22) Filed: Jan. 9, 2006

(65) Prior Publication Data

US 2006/0122740 A1 Jun. 8, 2006

Related U.S. Application Data

(63) Continuation of application No. 10/733,275, filed on Dec. 12, 2003, now Pat. No. 7,017,059.

(51) Int. Cl.
*G06F 1/00* (2006.01)
*G06F 1/26* (2006.01)
*G06F 1/32* (2006.01)
*G05D 23/00* (2006.01)

(52) U.S. Cl. ............... 713/322; 713/300; 713/310; 713/320; 713/330; 700/12; 700/276; 700/278; 700/300; 323/318

(58) Field of Classification Search .......... 700/12, 700/276, 275, 278, 300; 713/300, 310, 320, 713/322, 324, 330, 340; 323/318
See application file for complete search history.

(56) References Cited

U.S. PATENT DOCUMENTS

| | | | |
|---|---|---|---|
| 5,287,292 A | * | 2/1994 | Kenny et al. ............... 702/132 |
| 5,606,341 A | * | 2/1997 | Aguilera ....................... 345/87 |
| 5,664,118 A | * | 9/1997 | Nishigaki et al. ........... 710/304 |

(Continued)

FOREIGN PATENT DOCUMENTS

EP 0 320 720 A3 6/1989

OTHER PUBLICATIONS

UK Patent Office, Search Report for UK Patent Application No. GB0427108.6, Apr. 14, 2005.

(Continued)

*Primary Examiner*—Ramesh Patel
(74) *Attorney, Agent, or Firm*—Oyen Wiggs; Green & Mutala LLP

(57) ABSTRACT

An apparatus and method for replacing a CPU cooling system, for example, a fan, while a computer continues to operate has a mechanism for maintenance personnel to signal that cooling fan replacement is about to begin. In response to the signal, a control mechanism causes the CPU to shift into an operating mode in which heat generation is reduced. In some cases, a clock frequency of the affected CPU and/or a duty cycle at which the CPU operates is reduced. After the fan has been replaced the control mechanism returns the CPU to a normal operational mode, for example, by increasing the clock frequency or duty cycle to a normal level. During the fan replacement procedure, the CPU and its software continues to run at lower than normal performance.

39 Claims, 7 Drawing Sheets

U.S. PATENT DOCUMENTS

| | | | |
|---|---|---|---|
| 5,752,011 A | 5/1998 | Thomas et al. | |
| 5,842,029 A | 11/1998 | Conary et al. | |
| 5,930,110 A * | 7/1999 | Nishigaki et al. | 361/686 |
| 5,969,941 A * | 10/1999 | Cho | 361/687 |
| 6,006,168 A * | 12/1999 | Schumann et al. | 702/132 |
| 6,058,012 A | 5/2000 | Cooper et al. | |
| 6,065,930 A * | 5/2000 | Sato et al. | 416/39 |
| 6,088,807 A | 7/2000 | Maher et al. | |
| 6,375,440 B2 | 4/2002 | Kosugi | |
| 6,446,215 B1 | 9/2002 | Meyer et al. | |
| 6,463,396 B1 * | 10/2002 | Nishigaki | 702/132 |
| 6,470,289 B1 * | 10/2002 | Peters et al. | 702/132 |
| 6,526,333 B1 | 2/2003 | Henderson et al. | |
| 6,528,974 B1 | 3/2003 | Mirov et al. | |
| 6,704,875 B1 | 3/2004 | Kinoshita et al. | |
| 6,792,550 B2 | 9/2004 | Osecky et al. | |
| 6,822,861 B2 * | 11/2004 | Meir | 361/695 |
| 6,835,070 B1 * | 12/2004 | Law | 439/61 |
| 6,859,882 B2 | 2/2005 | Fung | |
| 6,873,883 B2 | 3/2005 | Ziarnik | |
| 6,928,559 B1 * | 8/2005 | Beard | 713/300 |
| 7,017,059 B2 * | 3/2006 | Law et al. | 713/322 |
| 2002/0007464 A1 | 1/2002 | Fung | |
| 2002/0067277 A1 | 6/2002 | Nishimura et al. | |
| 2002/0188875 A1 | 12/2002 | Hwang et al. | |
| 2003/0117760 A1 * | 6/2003 | Meir | 361/103 |
| 2003/0204758 A1 | 10/2003 | Singh | |
| 2003/0226675 A1 | 12/2003 | Osborn et al. | |
| 2004/0204016 A1 | 10/2004 | Sakamoto | |
| 2004/0236975 A1 | 11/2004 | Gaskins et al. | |
| 2005/0030171 A1 * | 2/2005 | Liu et al. | 340/500 |

OTHER PUBLICATIONS

Advanced Configuration and Power Interface Specification: Compaq Computer Corp., Intel Corp., Microsoft Corp., Phoenix Technologies Ltd., Toshiba Corp., Revision 2.0C.

* cited by examiner

METHODS AND APPARATUS FOR REPLACING COOLING SYSTEMS IN OPERATING COMPUTERS

RELATED APPLICATIONS

This application is a continuation of U.S. patent application Ser. No. 10/733,275 now U.S. Pat. No. 7,017,059, filed 12 Dec. 2003.

TECHNICAL FIELD

This invention relates to cooling computers and also to electronic devices generally which require cooling for continuous operation. Particular embodiments of the invention relate to maintaining computer cooling systems. Some specific embodiments of the invention permit the replacement of cooling fans in operating computers.

BACKGROUND

Computer data processing chips such as CPUs (central processing units), GPUs (graphics processing units) and the like are becoming increasingly powerful. This increase in performance has been accomplished by increasing clock frequencies, shrinking geometries within integrated circuits, and adding additional logic for more features.

Current high performance data processing chips generate significant amounts of heat. For example, some state of the art CPUs generate heat in excess of 80 watts. Since excessive temperatures can damage integrated circuits, it is common to provide active cooling systems to CPUs and similar devices. For example, it is common to attach large heat sinks to CPU chips and to provide a fan to ensure that there is adequate cooling air flow through the heat sink at all times while the computer is operating. If the air flow is interrupted for as little as a minute or two, the CPU can be destroyed by excessive heat buildup.

The fan may be mounted directly on the CPU heat sink to push air past the fins of the heat sink. The fan may alternatively be mounted elsewhere in the computer or on the surface of the computer's case. The fan is typically mounted in such a way that its air flow is directed to the vicinity of the CPU.

Like any other devices with moving mechanical parts, cooling fans can fail. If the cooling fan fails, air flow is interrupted. As a result, heat builds up in the CPU and the CPU's temperature can rise quickly to critical levels. Many modern computers prevent destruction of the CPU in such an eventuality by providing a system for monitoring the die temperature in the CPU. If the temperature of the die increases beyond a threshold temperature, the CPU is shut down. Shutdown of the CPU typically occurs very abruptly with no warning to software. The CPU essentially crashes. After the computer is restarted, it is necessary to return the CPU to an appropriate state and/or clean up any corrupted data resulting from the CPU crash before the computer can resume its intended role. The computer could be out of service for a significant period of time before a fan failure is detected and corrected.

In recent years, cooling fans have been improved such that incipient failures can be detected. Many cooling fans have voltage sensors and fan speed sensors. If the fan speed drops slowly over time then this may indicate that the fan is becoming clogged with dust and requires cleaning. An increase in the fan voltage which is not accompanied by a corresponding increase in the fan speed may indicate that the fan's bearings are starting to fail. With these improvements, it is sometimes possible to detect emerging problems before the fan fails. Computers are increasingly provided with software that monitors these sensors while the computer is operating. It is possible to shut down the computer gracefully to replace the fan instead of waiting for it to crash after the fan fails. If a graceful shutdown is achieved then the computer will be out of service for a shorter interval.

Some computers are required to operate continuously for long periods, in so-called "24×7" operation. For example, a computer may process sales orders for an online shopping web site. If such a computer is shut down to replace a cooling fan, revenue may be lost in direct proportion to the length of time that the computer is out of service. It is highly desirable to avoid shutting down the computer altogether or at least to minimize the length of time that the computer is out of service.

As another example, modern high performance computing systems (i.e. supercomputers) typically consist of hundreds or thousands of interconnected rack-mounted computers. Such computer systems often run a computer intensive application for hours or days across all of the computers making up such a system. The application runs a program on each of the computers. The programs communicate among themselves to share intermediate results. If one computer fails, the whole application will stop executing or fail. This may result in the loss of several hours or days worth of results.

To satisfy the needs of 24×7 operation, high performance computing systems, and other situations with similar requirements, it is desirable to find a way to change a cooling fan without interrupting the operation of a computer and without risking destruction of the CPU due to excessive heat.

SUMMARY OF THE INVENTION

One aspect of this invention provides a method for servicing a cooling system for an electronic device. The electronic device may be a CPU or a GPU in specific embodiments of the invention. The method involves switching the electronic device from a normal operating mode wherein the electronic device generates heat to a reduced heat generating mode wherein the electronic device generates heat at a reduced rate, in response to a person initiating a first signal indicating that the person is ready to service the cooling system. The method also involves continuing to operate the electronic device in the reduced heat generating mode while the cooling system is being serviced and subsequently switching the electronic device from the reduced heat generating mode to the normal operating mode.

Another aspect of the invention provides a method for servicing a cooling system for an electronic device which involves switching the electronic device from a normal operating mode wherein the electronic device generates heat to a reduced heat generating mode wherein the electronic device generates heat at a reduced rate. Once in the electronic device is switched to the reduced heat generating mode, the method comprises continuing to operate the electronic device in the reduced heat generating mode while the cooling system is being serviced by operating the electronic device at a reduced duty cycle. Subsequently, the method involves switching the electronic device from the reduced heat generating mode back to the normal operating mode.

A further aspect of the invention provides an electronic apparatus comprising a heat generating electronic device, a cooling system and a maintenance procedure controller. The maintenance procedure controller is configured to switch the electronic device from a normal operating mode, wherein the electronic device generates heat, to a reduced heat generating mode, wherein the electronic device generates heat at a reduced rate, upon detection of a first signal indicating that the cooling system is about to be serviced, the first signal initiated by a person to indicate that the person person is ready to service the cooling system. The maintenance procedure controller is also configured to switch the electronic device from the reduced heat generating mode to the normal operating mode upon detection of a second signal indicating that servicing of the cooling system has been completed.

Yet another aspect of the invention provides an electronic apparatus comprising a heat generating electronic device, a cooling system and a maintenance procedure controller. The maintenance procedure controller is configured to switch the electronic device from a normal operating mode, wherein the electronic device generates heat, to a reduced heat generating mode, wherein the electronic device generates heat at a reduced rate by reducing a duty cycle of the electronic device. The maintenance procedure controller is also configured to switch the electronic device from the reduced heat generating mode to the normal operating mode by increasing a duty cycle of the electronic device.

Further aspects of the invention and features of specific embodiments of the invention are described below.

BRIEF DESCRIPTION OF THE DRAWINGS

In drawings which illustrate non-limiting embodiments of the invention.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

This invention provides methods for repairing or replacing cooling systems for data processing chips which do not require the data processing chips to be shut down throughout the repair or replacement procedure. The methods involve temporarily shifting the data processing chips into a mode in which the data processing chips are still operating and yet generate less heat during a period while the cooling system is not operating.

The following description describes the application of the invention to cooling fans for CPUs. The invention may also be applied to other types of data processing chips such as graphics processors and the like. The invention may further be applied in systems which include cooling systems other than, or in addition to, fans.

Figure 1:
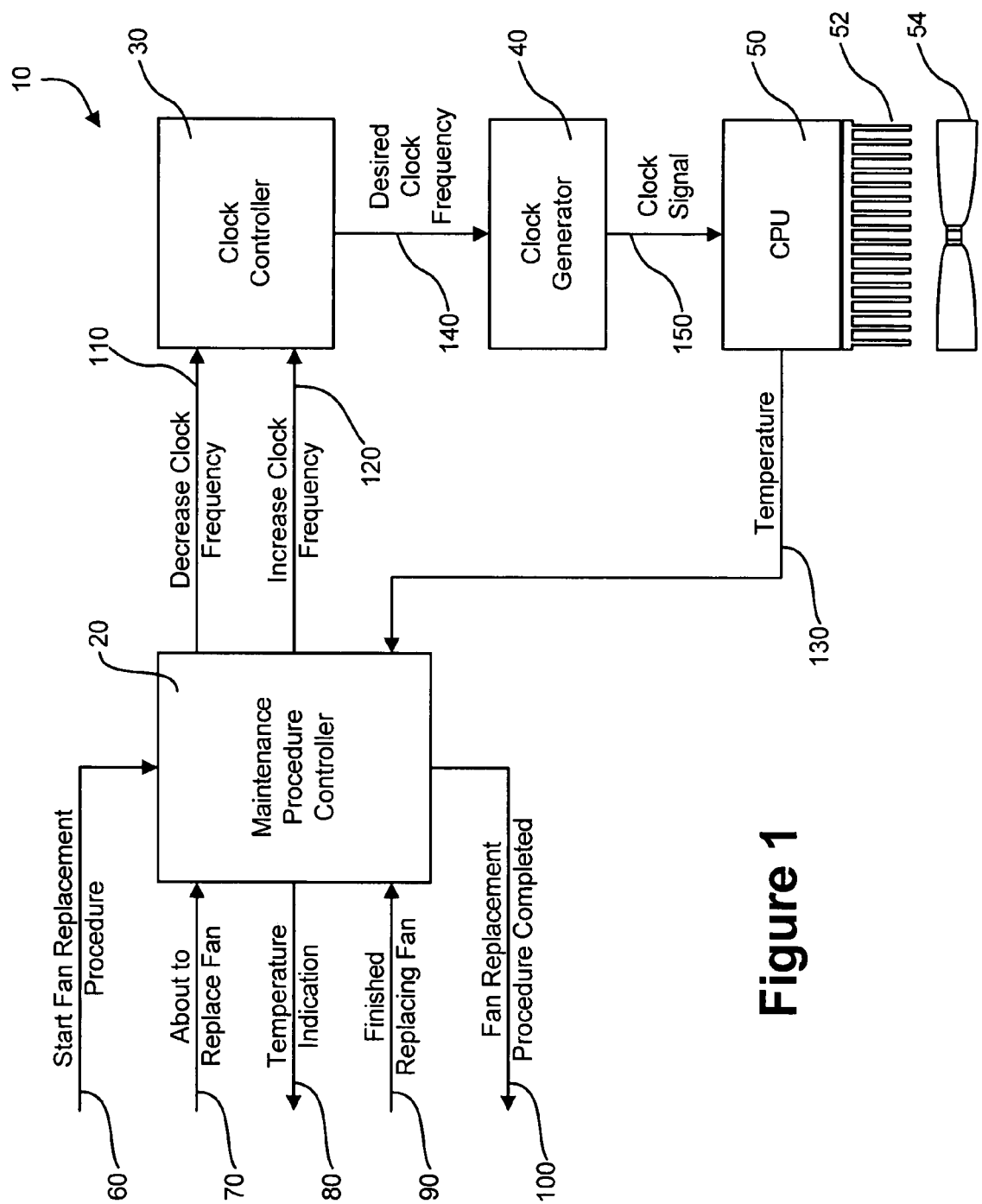
FIG. 1 is a block diagram of a CPU cooling apparatus according to one embodiment of the invention.

FIG. 1 shows a system 10 according to one implementation of the invention. System 10 includes a maintenance procedure controller 20. Maintenance procedure controller 20 comprises logic circuits which are connected to control a clock speed at which a CPU 50 operates. CPU 50 is cooled by a cooling system which includes a heat sink 52 and a fan 54. In the illustrated embodiment, maintenance procedure controller 20 communicates signals 110, 120 to a clock controller 30. Clock controller 30, in turn, generates a signal 140 which controls the clock frequency of a clock signal 150 generated by a clock generator 40.

Maintenance procedure controller 20 receives signals which indicate that a fan replacement procedure is commencing, or will imminently commence. In the illustrated embodiment, maintenance procedure controller 20 is connected to receive a Start Fan Replacement Procedure command 60. Maintenance personnel may cause command 60 to be issued through a user interface (e.g. textual command, GUI) or via a manual control (e.g. a button). Command 60 may, for example, originate at a console (not shown) which includes mechanisms for the overall administration of a system which includes processor 50. The system may include many other processors. For example, the system may be a multiprocessor computer system having, for example, several hundred CPUs.

Figure 2:
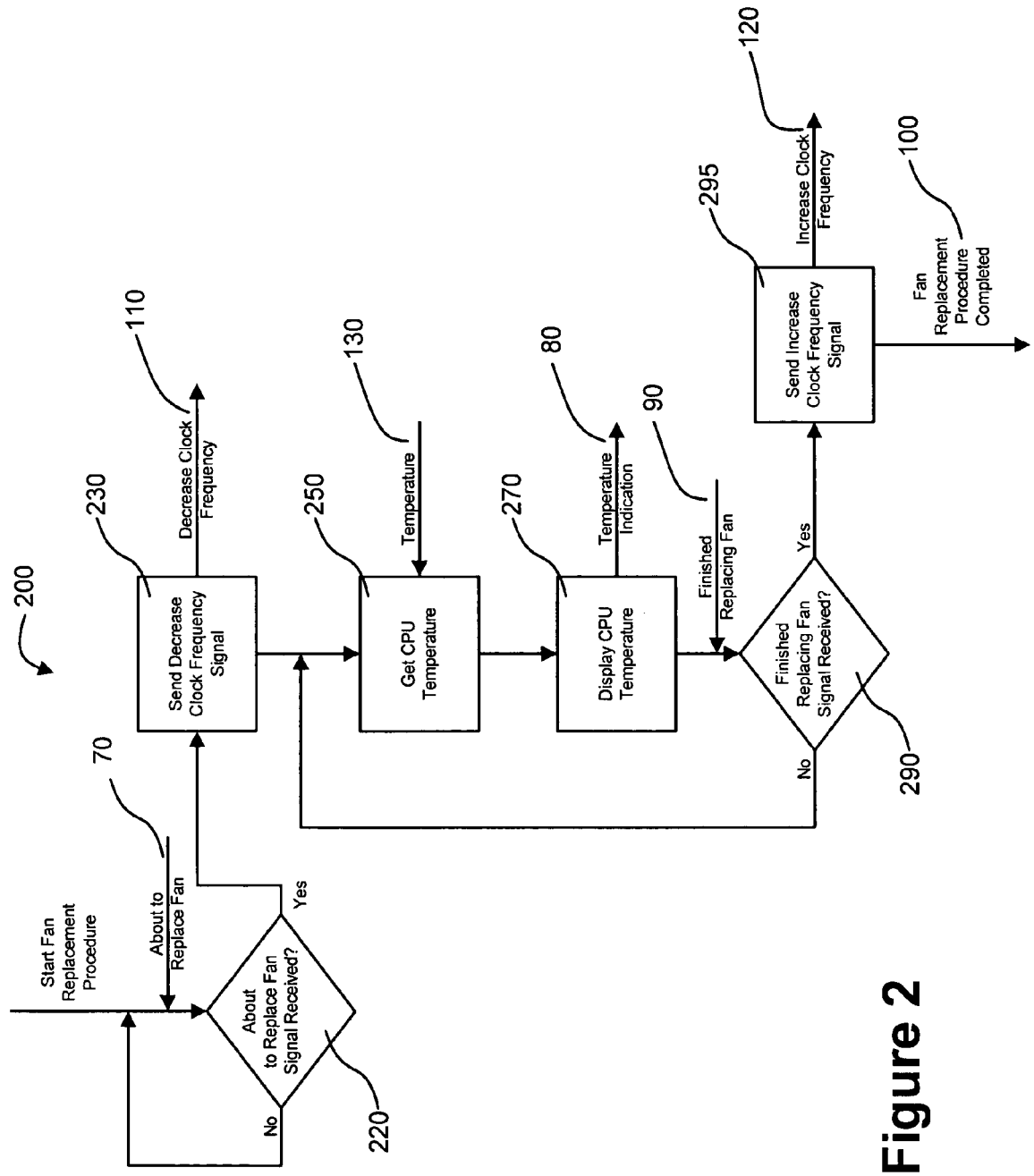
FIG. 2 is a flow chart illustrating a method for replacing a cooling system for a data processing chip without requiring the chip to be shut down completely.

Upon receiving command 60, maintenance procedure controller 20 commences performing a method 200 for permitting replacement of fan 54. Method 200 is shown in FIG. 2. Upon receiving signal 60, maintenance procedure controller 20 enters a mode in which it waits for an About to Replace Fan signal 70 from maintenance personnel. Signal 70 may be provided via a button or control panel on the computer in which processor 50 is located. Upon block 220 determining that a signal 70 has been received, maintenance procedure controller 20 sends a Decrease Clock Frequency signal 110 to clock controller 30 (block 230). In response to signal 110, clock controller 30 reduces the frequency indicated by Desired Clock Frequency signal 140. In response to signal 140, clock generator 40 reduces the frequency of the clock signal 150 that it applies to CPU 50. CPU 50 generates less heat when the frequency of clock signal 150 is reduced. The reduced heat generation at least slows the rate at which the die temperature of CPU 50 increases.

While CPU 50 is in a reduced heat generation mode, service personnel can remove and replace fan 54 without the die temperature of CPU 50 rising so much that CPU 50 becomes damaged.

While fan 54 is being replaced, CPU 50 optionally provides a signal indicating the current CPU temperature 130 to maintenance procedure controller 20 (block 250). Maintenance procedure controller 20 indicates the current CPU temperature to maintenance personnel as CPU temperature indication 80 (block 270). Indication 80 may be audible, visual (either textual or graphical) or the like. For example, maintenance procedure controller 20 may display the CPU temperature in a user interface on a control panel (not shown) of the computer. The display may be provided by way of any suitable technology. For example, the display may include any of: LCD display panels, LED or LCD displays, GUIs, and the like. The display may be located in any suitable location. In some embodiments, the display is located in a position where it is visible to a technician who is viewing CPU 50 through an opening in a case within which the cooling system for CPU 50 is housed.

The displayed temperature may be continuously updated to show the slow rise in temperature that occurs without the cooling air flow provided by the cooling fan. In the alternative or in addition, maintenance procedure controller 20 may generate warning signals if certain temperature thresholds are exceeded. Maintenance procedure controller may monitor the current temperature of CPU 50 and a rate at which the temperature of CPU 50 is increasing and may calculate and display an estimated amount of time remaining before a temperature threshold is reached. The estimated amount of time remaining may be used by maintenance personnel to determine whether the fan replacement is proceeding quickly enough to be completed before the temperature of CPU 50 rises to an unacceptable level.

After maintenance personnel have replaced fan 54, a Finished Replacing Fan signal 90 is provided to maintenance procedure controller 20. Signal 90 may be provided by operating a button or control panel on the computer. In response to receiving signal 90, (as determined at block 290) maintenance procedure controller 20 sends an Increase Clock Frequency signal 120 (block 295) to clock controller 30. Clock controller 30 responds by sending a larger Desired Clock Frequency signal 140 to clock generator 40. Clock generator 40 increases the frequency of the clock signal 150 that it applies to CPU 50. Once CPU 50 starts operating at the higher clock frequency 150, it generates additional heat. Maintenance procedure controller 20 terminates the fan replacement procedure and optionally issues a Fan Replacement Procedure Completed signal 100. In some embodiments, signal 100 is provided to a control console remote from CPU 50.

While CPU 50 is being run in the reduced heat generation mode, the frequency of clock signal 150 is reduced to a low, but non-zero level. As a result, CPU 50 continues to execute software instructions during the procedure. In some embodiments of the invention, the frequency of the clock signal is reduced to 15% or less, and preferably to 10% or less of its normal value (i.e. the clock frequency is reduced by 85%, and preferably by 90% in switching from the normal operating mode to the reduced heat generating mode). For example, a normal 2.0 GHz clock signal applied to CPU 50 might be reduced to 100 MHz (5% of its normal value), or less while CPU 50 is being run in the reduced heat generation mode. For another example, in the normal operating mode the clock frequency may be in excess of 1.5 GHz and in the reduced heat generating mode the clock frequency may be less than 250 MHz.

While cooling fan 54 is removed, and CPU 50 is running in the reduced heat generation mode, the temperature of CPU 50 may continue to rise. Therefore, if the cooling fan is not replaced and put back into operation soon enough even at the reduced clock frequency the temperature of CPU 50 may rise to an unacceptable level. Most modern CPUs are equipped with thermal protection and will shut down if safe operating temperatures are exceeded. Where CPU 50 includes such thermal protection, if the maintenance personnel do not replace the cooling fan soon enough, CPU 50 will be shut down before it is damaged.

Maintenance procedure controller 20 may optionally be capable of causing CPU 50 to shut down. Maintenance procedure controller 20 may monitor a current CPU temperature 130. If CPU temperature 130 exceeds a threshold, then maintenance procedure controller 20 could send a signal to cause CPU 50 to be shut down. This functionality may be used to particular advantage in cases where CPU 50 does not have built-in over-temperature protection.

In the apparatus shown in FIG. 1, clock controller 30 and clock generator 40 are shown as being separate from CPU 50. These components could be combined in any suitable combination. By way of example only, clock controller 30 and clock generator 40 could be integrated with one another; one or both of clock controller 30 and clock generator 40 could be integrated with CPU 50.

Figure 3:
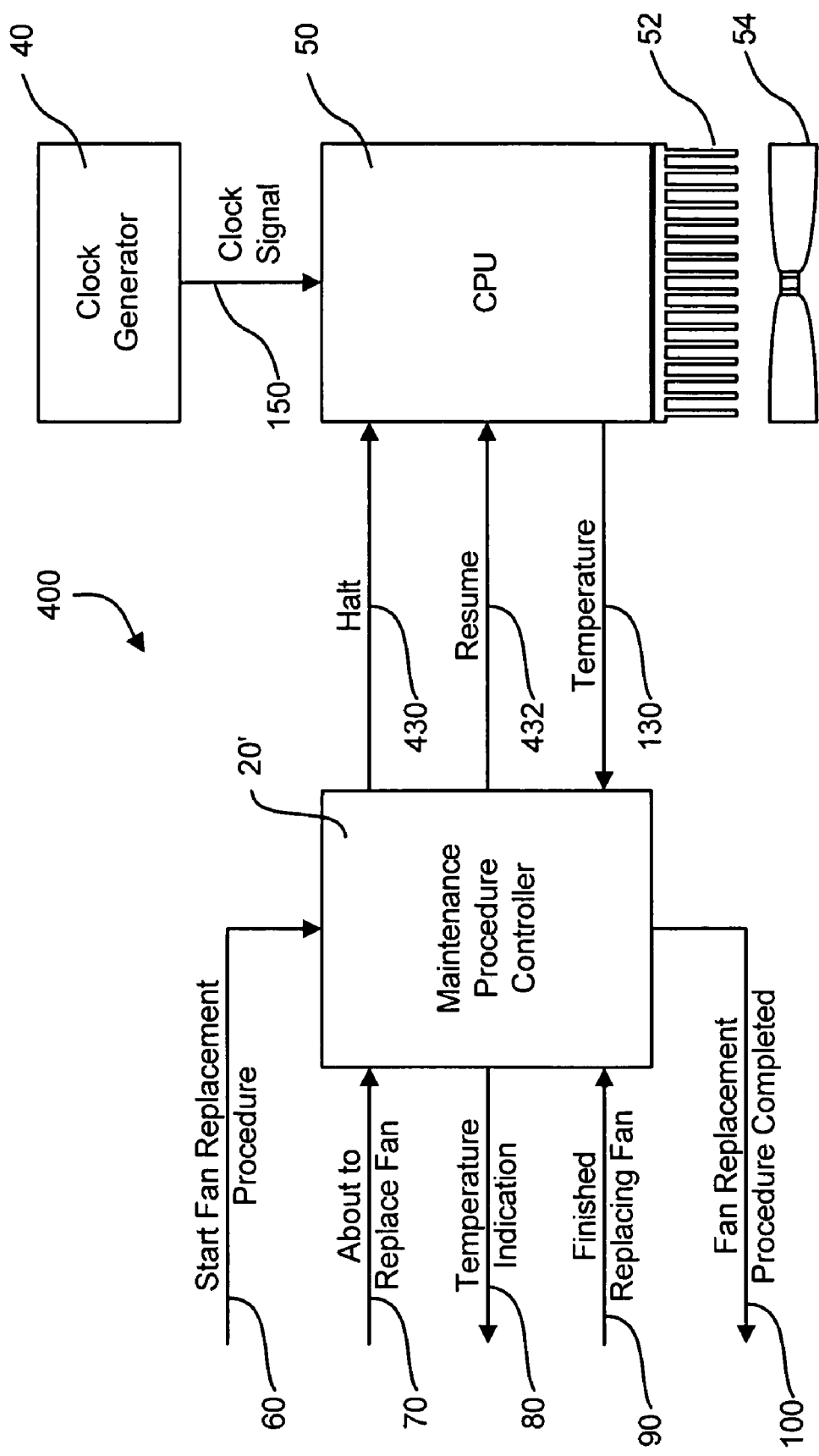
FIG. 3 is a block diagram illustrating an apparatus according to another embodiment of the invention.

FIG. 3 shows a system 400 according to an alternative implementation of the invention. Maintenance procedure controller 20' interacts with maintenance personnel as described above. However, instead of controlling a frequency of clock signal 150 by interacting with clock generator 40, maintenance procedure controller 20' issues a stream of HALT 430 and RESUME 432 commands to CPU 50. Commands 430 and 432 may comprise any suitable signals provided to CPU 50. For example, issuing a sequence of commands 430 and 432 may comprise toggling logic signals applied to a halt pin on CPU 50. HALT commands 430 disable CPU 50 or otherwise place CPU 50 in an idle state in which heat generation is significantly reduced. RESUME commands 432 enable CPU 50. The rate at which CPU 50 generates heat can be controlled by varying the relative lengths of time during which CPU 50 is enabled and disabled. In system 400, the frequency of clock signal 150 does not need to be adjusted during the fan replacement procedure.

Figure 4:
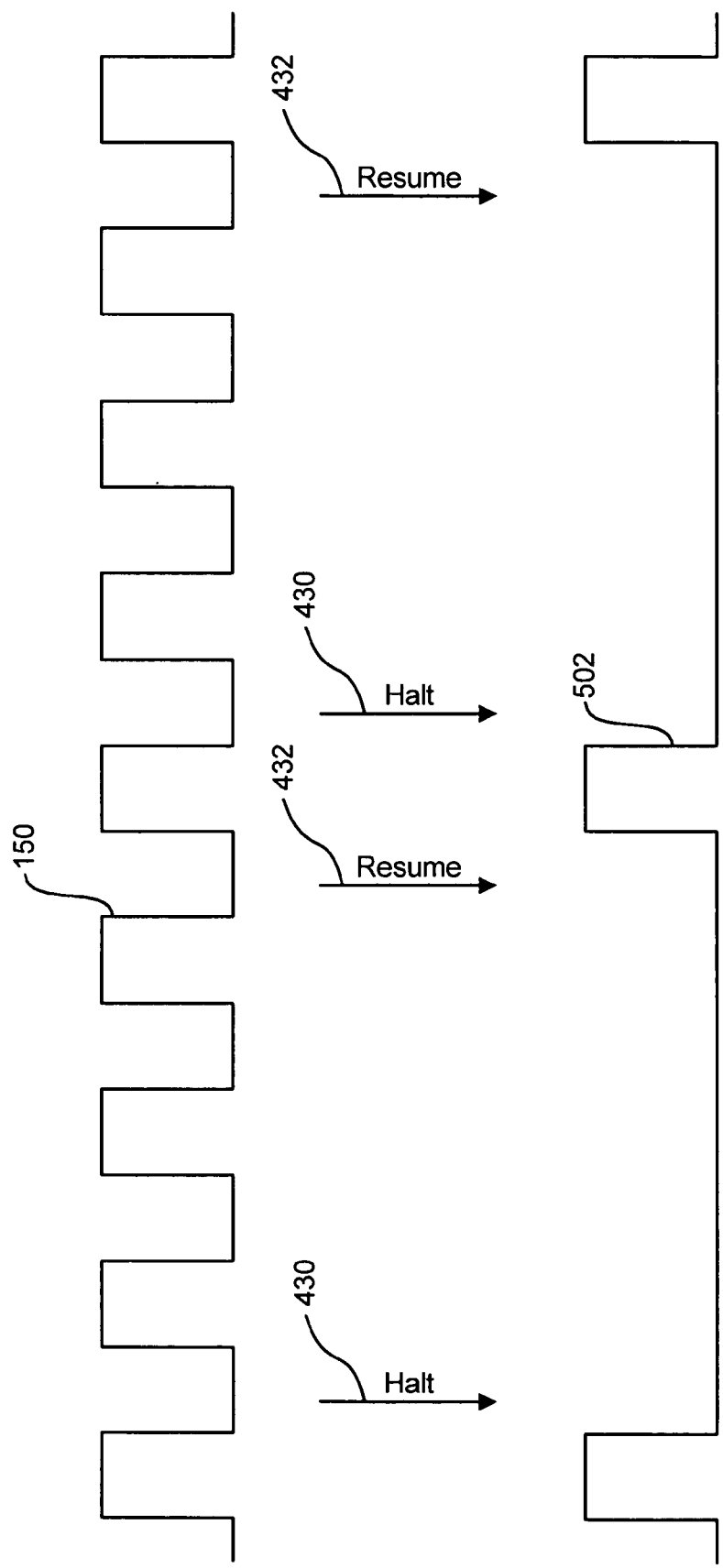
FIG. 4 is a timing diagram illustrating a possible mode of operation of the apparatus of FIG. 3.

As seen in FIG. 4, the periodic HALT 430 and RESUME 432 commands impose a duty cycle on clock signal 150. The result is that CPU 50 experiences an effective clock signal 502. In the example of FIG. 4, CPU 50 is only enabled for one out of every four pulses of clock signal 150 (i.e. effective clock signal 502 has a 25% duty cycle—3 out of 4 clock pulses have been removed leaving 1 out of 4 clock pulses). In this example, the stream of HALT and RESUME commands cause CPU 50 to run at 25% of its regular speed. Heat output is reduced. By varying the periodicity of the alternating HALT and RESUME commands, duty cycles of less than or greater than 25% can be achieved. In some embodiments of the invention, running CPU 50 in the reduced heat generation mode comprises applying HALT and RESUME commands such that the CPU operates at a duty cycle of 25% or less.

Returning to FIG. 3, during the fan replacement, temperature 130 may be monitored and displayed to the maintenance personnel, as described above. When maintenance procedure controller 20' receives a Finished Replacing Fan signal 90 from the maintenance personnel, maintenance procedure controller 20' returns CPU 50 to a full duty cycle clock signal (for example, by issuing a RESUME command and then ceasing issuing the stream of HALT and RESUME commands). The fan replacement procedure subsequently terminates.

The duty cycle of microprocessor 50 may be varied in other manners than by issuing HALT and RESUME commands. Existing microprocessors (e.g. Intel Pentium IV™ and AMD Opteron™) have built-in mechanisms for changing the duty cycle in increments of 12.5% as part of their support for the Advanced Configuration and Power Interface (ACPI) management standard. Periodically halting CPU 50 can provide finer control over the duty cycle of CPU 50 than is possible by using current ACPI functionality. In some embodiments of the invention, both built-in mechanisms, for example ACPI, and external mechanisms, for example toggling a signal applied to a HALT pin, are used in combination to achieve the reduced heat generating mode.

Figure 5:
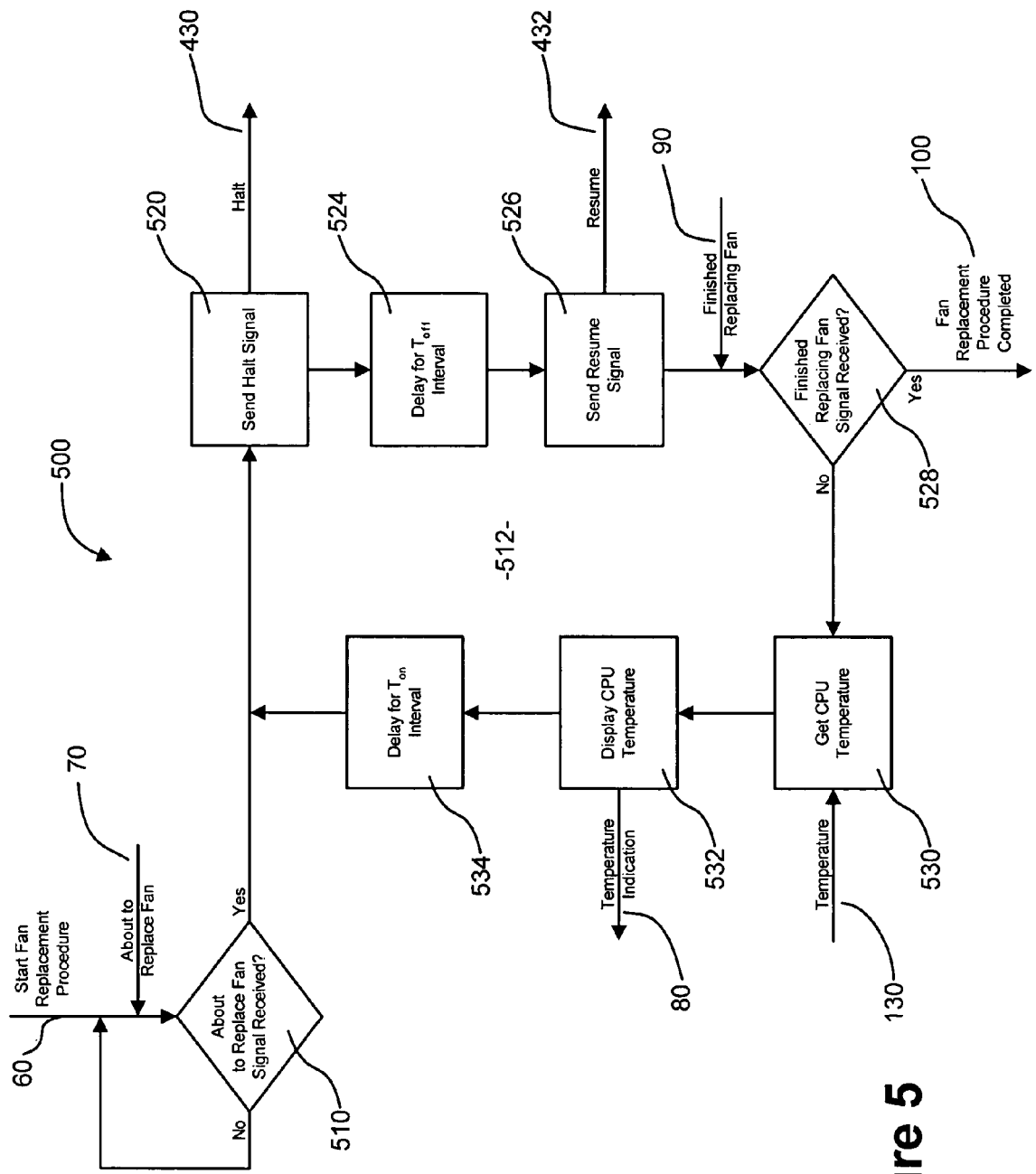
FIG. 5 is a flow chart illustrating a method according to another embodiment of the invention.

FIG. 5 is a flowchart illustrating a method 500 which may be performed by maintenance procedure controller 20' in system 400 of FIG. 3. Method 500 starts upon receipt of a Start Fan Replacement Procedure signal 60. Method 500 loops at block 510 until an About to Replace Fan signal 70 is received from the maintenance personnel. After signal 70 is received, a sequence of alternating HALT and RESUME commands 430 and 432 are generated in loop 512.

In block 520 a HALT command 430 is sent to CPU 50. Method 500 then waits in block 524 for an interval $T_{off}$ before sending a RESUME command 432 to CPU 50 in block 526. If block 528 determines that a Finished Replacing Fan signal 90 has been received from the maintenance personnel, then method 500 optionally sends a Fan Replacement Procedure Completed signal 100 and terminates. The CPU is running at full duty cycle as a result of the Resume command 432 issued in the most recent iteration of block 526.

If block 528 determines that signal 90 has not been received, method 500 proceeds to block 530 where a current CPU temperature 130 of CPU 50 is monitored. In block 532 method 500 displays the current CPU temperature. In block 534 method 500 waits for a period $T_{on}$ before continuing to block 520. Neglecting the time taken to execute blocks other than blocks 524 and 534, method 500 provides a duty cycle of approximately $T_{on}/(T_{off}+T_{on})$.

Figure 6:
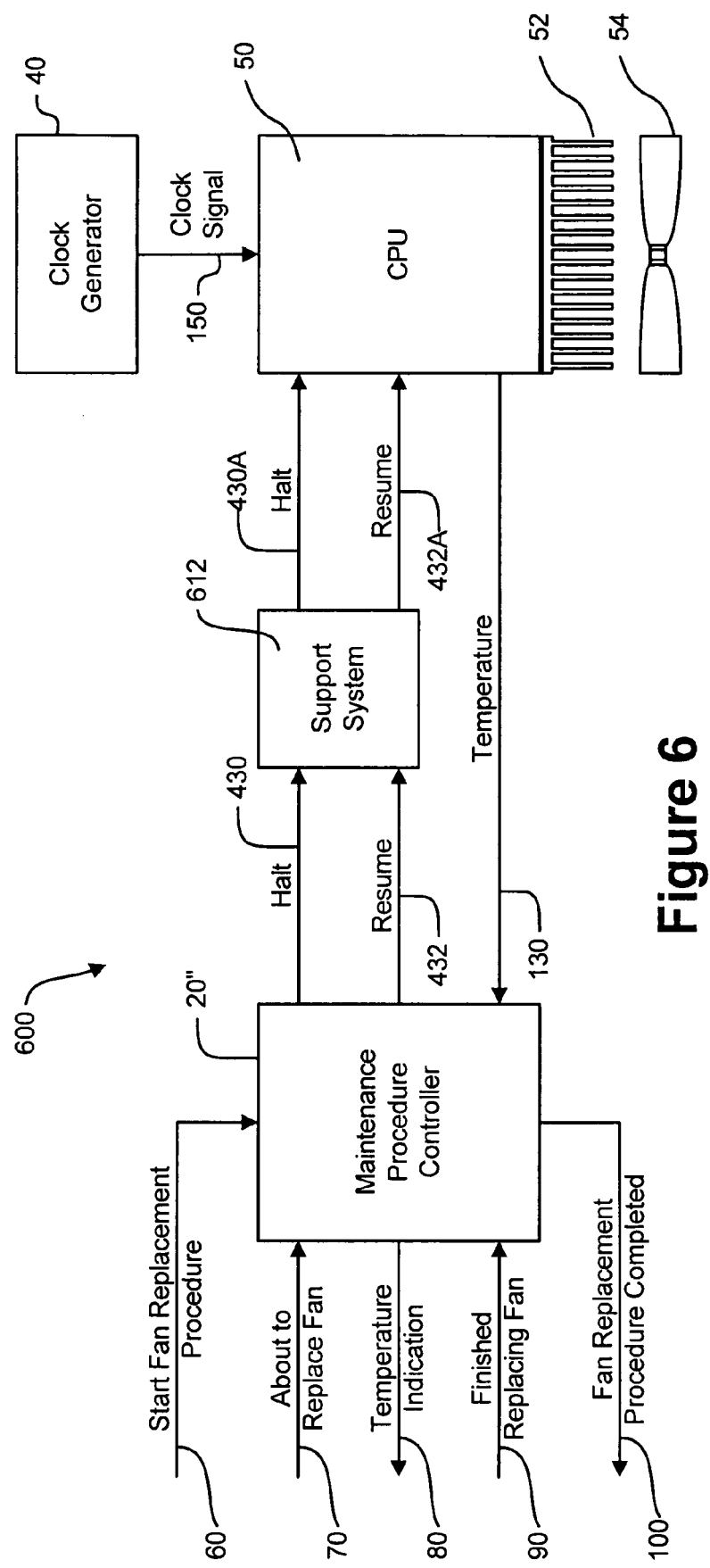
FIG. 6 is a block diagram illustrating an apparatus according to a further embodiment of the invention; and, FIG. 7 is a schematic view of a computer system according to an example embodiment of the invention.

FIG. 6 is a block diagram of apparatus 600 which is a variation of apparatus 400 of FIG. 3. In apparatus 600 maintenance procedure controller 20" does not directly send Halt and Resume commands 430, 432 to CPU 50. Instead, maintenance procedure controller 20" sends HALT and RESUME commands 430, 432 to a support system 612. Support system 612 is typically provided in an integrated circuit. Support system 612 issues HALT and RESUME commands 430A and 432A respectively to CPU 50 in response to receiving HALT and RESUME commands 430, 432 from maintenance procedure controller 20". Support system 612 may comprise a support chip (e.g. north bridge, south bridge, I/O hub, etc.). Support system 612 may implement the ACPI management standard.

In some embodiments of the invention a computer system which houses CPU 50 or a computer system which is physically near to CPU 50 includes a software configurable control. Upon the receipt of Start Fan Replacement Procedure signal 60 the control is placed in a first mode such that a first activation of the control causes About to Replace Fan signal 70 to be generated. The first activation of the control directly or indirectly places the control in a second mode. When the control is in the second mode, activation of the control causes Finished Replacing Fan signal 90 to be generated.

In apparatus according to other embodiments of the invention About to Replace Fan signal 70 and/or Finished Replacing Fan signal 90 are generated automatically in response to monitoring parameters relating to the fan. For example, upon the receipt of Start Fan Replacement Procedure signal 60, a maintenance procedure controller may monitor a current draw of the fan. If the fan current draw suddenly drops to zero (as would occur if a technician disconnected the fan from its power source in preparation for removing the fan) the maintenance procedure controller automatically generates About to Replace Fan signal 70 (for example, by interpreting the current drop as About to Replace Fan signal 70 or by causing a separate signal to be generated). When the fan current draw returns to a typical value (as would occur when the technician connects a replacement fan)—or when the fan current draw returns to a typical value and the CPU temperature begins to level off or drop—the maintenance procedure controller automatically generates Finished Replacing Fan signal 90. The portion of the maintenance procedure controller which monitors fan current draw may be physically separated from other parts of the maintenance procedure controller.

In apparatus according to other embodiments of the invention the About to Replace Fan signal 70 may be generated automatically in response to the opening of a service panel. For example, opening a service panel to access a cooling system for CPU 50 (e.g. fan 54) may change the state of a microswitch which causes About to Replace Fan signal 70 to be generated.

In any of the implementations of the invention described above, the maintenance procedure controller may comprise: a suitably programmed data processor; hardware logic circuits, which may be provided in the form of an FPGA (Field Programmable Gate Array), ASIC (Application Specific Integrated Circuit), etc.; or some combination thereof. In some embodiments of the invention the functions of the maintenance procedure controller are provided by hardware, or hardware and software resident within a single integrated circuit. Where CPU 50 is part of a multi-processor computer system, the functions of the maintenance procedure controller may be provided by causing one of the other processors in the multi-processor computer system to act as the maintenance procedure controller.

Figure 7:
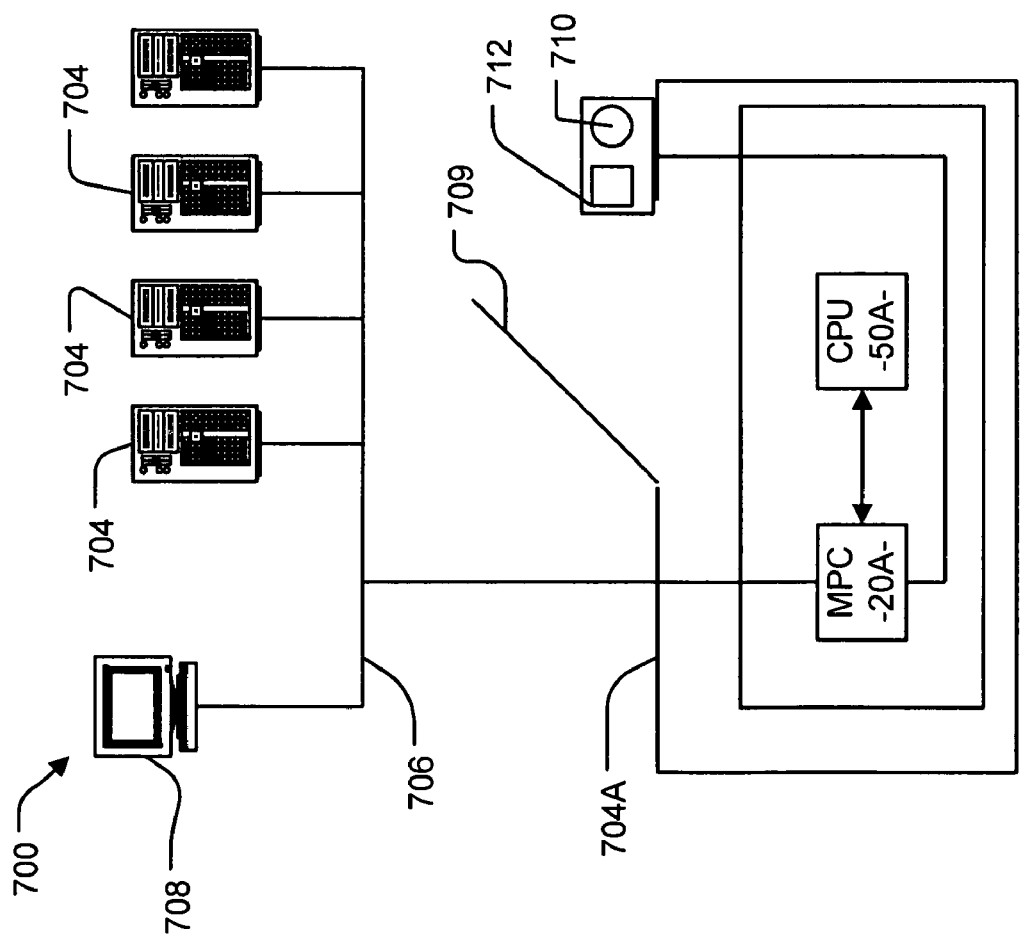

As an example implementation of the invention, consider a multi-processor computer system 700 as shown in FIG. 7. System 700 has hundreds of CPUs 50 & each cooled by a fan or other cooling system. CPUs 50 are distributed among a number of chassis 704 which are interconnected by a data communication network 706. Each chassis 704 may house one or several CPUs 50. Computer system 700 has a control console 708 which can communicate with each of the chassis. Maintenance staff decide that the cooling system of one CPU 50A requires replacement. A person at console 708 causes the console to issue a Start Fan Replacement Procedure to a maintenance procedure controller 20A associated with CPU 50A.

Maintenance procedure controller 20A is connected to detect a signal which results when maintenance personnel activate a control 710 associated with the chassis 704A in which CPU 50A is housed. In this example, control 710 is a pushbutton on chassis 704A. In response to the Start Fan Replacement Procedure signal, maintenance procedure controller 20A configures itself to interpret the signal resulting from the actuation of control 710 as an About to Replace Fan signal.

A technician proceeds to chassis 704A. The technician may access CPU 50A through a service panel 709 or other suitable opening. When the technician is ready to replace the cooling system for CPU 50A, the technician actuates control 710. Maintenance procedure controller 20A then causes CPU 50A to operate in a reduced heat generating mode and configures itself to recognize the next actuation of control 710 as a Finished Replacing Fan signal. The technician replaces or otherwise services the cooling system for CPU 50A. While the technician is servicing the cooling system for CPU 50A, maintenance procedure controller 20A causes the current temperature of CPU 50A and the estimated time remaining before the cooling system must be placed back in service or the CPU 50A shut down on a display 712 located where the technician can see it.

When the technician completes servicing the cooling system for CPU 50A, the technician actuates control 710 again. This causes maintenance procedure controller 20A to place CPU 50A in its normal operating mode and to send a Fan Replacement Completed signal back to console 708 where it can be logged.

Commands and other signals may be implemented in any suitable manner including by way of technologies such as:
analog or digital electrical signals;
packet-based message protocols;
optical signals;
signals carried on a wireless data communication medium;
combinations of the above;
and the like.

Certain implementations of the invention comprise computer processors which execute software instructions which cause the processors to perform a method of the invention. For example, the maintenance procedure controllers in any of the embodiments described herein may comprise one or more processors executing software commands which cause the processors to implement methods of the invention such as, for example, the methods of FIGS. 2 or 5. The invention may also be provided in the form of a program product. The program product may comprise any medium which carries a set of computer-readable signals comprising instructions which, when executed by a data processor, cause the data processor to execute a method of the invention. Program products according to the invention may be in any of a wide variety of forms. The program products may comprise, for example, physical media such as magnetic data storage media including floppy diskettes, hard disk drives, optical data storage media including CD ROMs, DVDs, electronic data storage media including ROMs, flash RAM, or the like or transmission-type media such as digital or analog communication links.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

As will be apparent to those skilled in the art in light of the foregoing disclosure, many alterations and modifications are possible in the practice of this invention without departing from the spirit or scope thereof. For example:

Some of the embodiments described above place CPU 50 into a reduced heat generating mode by reducing the frequency of clock signal 150, in other embodiments, the same end is achieved by reducing the duty cycle of CPU 50. In other embodiments of the invention, placing CPU 50 into the reduced heat generating mode involves both reducing the frequency of clock signal 150 and reducing a duty cycle of CPU 50.

The reduced heat generating mode need not be characterized by a constant clock frequency and/or duty cycle. In some embodiments of the invention the clock frequency and/or duty cycle are varied when CPU 50 is in the reduced heat generating mode. In some such embodiments, the clock frequency and/or duty cycle are varied in response to the CPU temperature so as to maintain the rate at which the CPU temperature rises below a threshold or so as to provide at least a predetermined amount of time before the CPU temperature rises to some threshold value. In some embodiments, the clock frequency and/or duty cycle are varied so as to control the temperature of CPU 50 to increase at about, but not more than, a maximum desired rate. The maximum desired rate is selected to provide sufficient time for servicing the cooling system. Controlling the CPU to allow its temperature to increase at about the maximum desired rate avoids reducing performance of CPU 50 by an unnecessarily large amount. The maximum desired rate may be configurable. If the maximum desired rate is configurable, a slow technician, or a technician who has a complicated service operation to perform may select a lower maximum desired rate than a faster technician, or a technician who has to perform a very simple service operation which can be completed quickly.

The reduced heat generating mode may be achieved in manners other than as described above. For example, heat-generating subsystems within CPU 50 (or another electronic device to which the invention is being applied) may be halted, disabled, or otherwise caused to generate reduced heat in the reduced heat generating mode. In some embodiments of the invention CPU 50 includes a cache memory and placing CPU 50 into the reduced heat generating mode comprises either disabling the cache memory or operating the cache memory at a reduced frequency.

Service personnel may use any suitable mechanisms to generate About to Replace Fan signal 70 and Finished Replacing Fan signal 90.

While the invention has been discussed in terms of decreasing the heat output by a CPU while a cooling fan is being replaced, the invention is equally applicable to any similar computer system component that generates significant heat. For example, the invention could be applied to a graphics processing unit (GPU) on a video card.

There need not be a 1:1 relationship between CPUs 50 and maintenance procedure controllers 20 (or 20' or 20"). A single maintenance procedure controller 20 (or 20' or 20") may be provided to permit maintenance of the cooling systems of several CPUs.

The methods of the invention may comprise operating an auxiliary active cooling system to provide supplementary cooling to CPU 50 (or another electronic device to which the invention is being applied) while the cooling system associated with CPU 50 is being serviced. The auxiliary cooling system may comprise a cooling system which normally cools some other device, such as an adjacent CPU 50. For example, operating the auxiliary cooling system to provide some cooling to CPU 50 may comprise operating a fan which normally cools a nearby CPU 50, or a fan which normally operates to ventilate a housing within which a heat sink associated with CPU 50 is located at a higher than normal speed so as to cause some cooling airflow past CPU 50.

Some general methods according to the invention are for servicing a cooling system associated with one or more electronic devices in an apparatus. Such general methods comprise servicing the cooling system associated with the one or more electronic devices, for example by replacing the cooling system or a component thereof. While the servicing is depriving the one or more electronic devices of their normal cooling, the methods operate the apparatus in a temperature control mode which reduces temperature rise in the one or more electronic devices. The one or more electronic devices continue to operate. In such embodiments of the invention the temperature control mode may comprise operating the one or more electronic devices in a reduced heat generating mode, for example, in any manner described herein, and/or providing supplementary active cooling to the one or more electronic devices, for example by operating a cooling system in the apparatus at a higher than normal output, while the cooling system associated with the one or more electronic devices is serviced.

Accordingly, the scope of the invention is to be construed in accordance with the substance defined by the following claims.

What is claimed is:

1. A method for servicing a cooling system for an electronic device, the method comprising:
   receiving a first signal generated in response to an action of a person, the action indicating that the person is ready to service the cooling system,
   in response to the first signal, switching the electronic device from a normal operating mode, wherein the electronic device generates heat, to a reduced heat generating mode wherein the electronic device generates heat at a reduced rate;
   continuing to operate the electronic device in the reduced heat generating mode while the cooling system is being serviced; and,
   switching the electronic device from the reduced heat generating mode to the normal operating mode after the cooling system has been serviced.

2. A method according to claim 1 wherein switching the electronic device from the reduced heat generating mode to the normal operating mode occurs in response to receiving a second signal generated in response to a second action of a person, the second signal indicating that the servicing of the cooling system has been completed.

3. A method according to claim 1 wherein switching the electronic device from the normal operating mode to the reduced heat generating mode comprises reducing a frequency of a clock signal of the electronic device.

4. A method according to claim 3 wherein reducing the frequency of the clock signal comprises reducing the frequency of the clock signal by 85% or more.

5. A method according to claim 1 wherein switching the electronic device from the normal operating mode to the reduced heat generating mode comprises disabling one or more subsystems within the electronic device.

6. A method according to claim 1 wherein the electronic device comprises a data processor and the method comprises continuing to execute instructions in the data processor while the electronic device is in the reduced heat generating mode.

7. A method according to claim 6 wherein continuing to operate the electronic device in the reduced heat generating mode comprises operating the electronic device at a reduced duty cycle.

8. A method according to claim 7 wherein operating the electronic device at a reduced duty cycle comprises issuing an alternating sequence of HALT and RESTART commands to the electronic device.

9. A method according to claim 8 wherein issuing the HALT command to the electronic device temporarily discontinues all operation of the electronic device from a time when the HALT command is received at the electronic device until a time when the next RESTART command is received at the electronic device.

10. A method according to claim 9 wherein a time period between the time when the HALT command is received at the electronic device and the time when the next RESTART command is received at the electronic device is greater than or equal to a period of a clock signal of the electronic device.

11. A method according to claim 9 wherein a time period between times that successive HALT commands are received at the electronic device is greater than or equal to a period of a clock signal of the electronic device.

12. A method according to claim 9 wherein a time period between the time when the HALT command is received at the electronic device and the time when the next RESTART command is received at the electronic device is 75% or more of a time period between times that successive HALT commands are received at the electronic device.

13. A method according to claim 9 wherein issuing the alternating sequence of HALT and RESTART commands to the electronic device comprises toggling a logic signal applied to a halt pin on the electronic device.

14. A method according to claim 7 wherein operating the electronic device at the reduced duty cycle comprises using a reduced duty cycle protocol provided as a part of the electronic device.

15. A method according to claim 14 wherein the reduced duty cycle protocol comprises a protocol operating according to an Advanced Configuration and Power Interface standard.

16. A method according to claim 7 wherein continuing to operate the electronic device in the reduced heat generating mode comprises operating the electronic device at a reduced clock frequency, the reduced clock frequency lower than a normal clock frequency at which the electronic device operates in the normal operating mode.

17. A method according to claim 1 comprising monitoring a temperature of the electronic device while continuing to operate the electronic device in the reduced heat generating mode and displaying the monitored temperature of the electronic device on a display while continuing to operate the electronic device in the reduced heat generating mode.

18. A method according to claim 1 comprising monitoring a temperature of the electronic device while continuing to operate the electronic device in the reduced heat generating mode and indicating the monitored temperature of the electronic device by way of an audible signal while continuing to operate the electronic device in the reduced heat generating mode.

19. A method according to claim 1 comprising monitoring a temperature of the electronic device while continuing to operate the electronic device in the reduced heat generating mode and determining, based at least in part on the monitored temperature, an estimated time until the temperature of the electronic device reaches a threshold value.

20. A method according to claim 1 comprising servicing the cooling system while continuing to operate the electronic device in the reduced heat generating mode by replacing a fan in the cooling system.

21. A method for servicing a cooling system for an electronic device, the method comprising:
   switching the electronic device from a normal operating mode wherein the electronic device generates heat to a reduced heat generating mode wherein the electronic device generates heat at a reduced rate;
   continuing to operate the electronic device in the reduced heat generating mode while the cooling system is being serviced; and,
   switching the electronic device from the reduced heat generating mode to the normal operating mode after the cooling system has been serviced.

22. A method according to claim 21 wherein continuing to operate the electronic device in the reduced heat generating mode while the cooling system is being serviced comprises operating the electronic device at a reduced duty cycle.

23. Electronic apparatus comprising:
a heat generating electronic device;
a cooling system operational to cool the electronic device;
means for detecting an action of a person and generating a first signal in response thereto, the action indicating that the person is ready to service the cooling system; and
a maintenance procedure controller configured to:
switch the electronic device from a normal operating mode, wherein the electronic device generates heat, to a reduced heat generating mode, wherein the electronic device generates heat at a reduced rate, in response to the first signal; and
switch the electronic device from the reduced heat generating mode to the normal operating mode in response to a second signal indicating that servicing of the cooling system has been completed.

24. An apparatus according to claim 23 wherein the second signal is initiated by a person to indicate that the person has completed servicing the cooling system.

25. An apparatus according to claim 23 comprising a clock generator operative to generate a clock signal supplied to the electronic device wherein the maintenance procedure controller is connected to reduce the frequency of the clock signal upon detection of the first signal and to increase the frequency of the clock signal upon detection of the second signal.

26. An apparatus according to claim 25 wherein the maintenance procedure controller is configured to reduce the frequency of the clock signal by 85% or more upon detection of the first signal.

27. An apparatus according to claim 23 wherein the maintenance procedure controller is configured to disable one or more subsystems within the electronic device upon receipt of the first signal.

28. An apparatus according to claim 23 comprising a temperature sensor connected to monitor a temperature of the electronic device while the electronic device in the reduced heat generating mode and a display for displaying the monitored temperature of the electronic device.

29. An apparatus according to claim 23 comprising a temperature sensor connected to monitor a temperature of the electronic device while the electronic device in the reduced heat generating mode and an audio device for indicating the monitored temperature of the electronic device by way of an audible signal.

30. An apparatus according to claim 23 wherein the maintenance procedure controller is configured to determine an estimated time until the temperature of the electronic device reaches a threshold value.

31. Apparatus according to claim 30 comprising a temperature sensor connected to monitor a temperature of the electronic device while the electronic device is in the reduced heat generating mode wherein the maintenance procedure controller is configured to determine the estimated time based at least in part on an output of the temperature sensor.

32. An apparatus according to claim 23 wherein the maintenance procedure controller is configured to reduce a duty cycle of the electronic device upon detection of the first signal and to increase the duty cycle of the electronic device upon detection of the second signal.

33. An apparatus according to claim 32 wherein the maintenance procedure controller is configured to issue an alternating sequence of HALT and RESTART commands to the electronic device upon detection of the first signal.

34. An apparatus according to claim 33 wherein the electronic device is configured to cease operation upon receipt of the HALT command and to resume operation at a time when the next RESTART command is received at the electronic device.

35. An apparatus according to claim 34 wherein the maintenance procedure controller is configured to leave a time period between the time when the HALT command is issued to the electronic device and the time when a next RESTART command is issued to the electronic device wherein the time period is greater than or equal to a period of a clock signal of the electronic device.

36. An apparatus according to claim 35 wherein the maintenance procedure controller is configured so that a time period between times that successive HALT commands are issued to the electronic device is greater than or equal to a period of a clock signal of the electronic device.

37. An apparatus according to claim 32 wherein the maintenance procedure controller is configured to reduce the duty cycle of the electronic device using a reduced duty cycle protocol provided as a part of the electronic device.

38. An apparatus according to claim 37 wherein the reduced duty cycle protocol comprises a protocol operating according to an Advanced Configuration and Power Interface standard.

39. An electronic apparatus comprising:
a heat generating electronic device;
a cooling system operational to cool the electronic device; and
a maintenance procedure controller configured to:
switch the electronic device from a normal operating mode, wherein the electronic device generates heat, to a reduced heat generating mode, wherein the electronic device generates heat at a reduced rate by reducing a duty cycle of the electronic device; and
switch the electronic device from the reduced heat generating mode to the normal operating mode by increasing a duty cycle of the electronic device.

* * * * *